(12) United States Patent
Qiu et al.

(10) Patent No.: US 10,847,855 B2
(45) Date of Patent: Nov. 24, 2020

(54) DIELECTRIC RESONATOR AND FILTER COMPRISING A BODY WITH A RESONANT HOLE SURROUNDED BY AN ENCIRCLEMENT WALL HAVING A RING SHAPED EXPOSED DIELECTRIC AREA

(71) Applicant: HUAWEI TECHNOLOGIES CO., LTD., Guangdong (CN)

(72) Inventors: Lixia Qiu, Kista (SE); Xiaofeng Zhang, Chengdu (CN); Zhiyu Liu, Chengdu (CN); Zhen Shen, Shanghai (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 15/989,279

(22) Filed: May 25, 2018

(65) Prior Publication Data
US 2018/0277916 A1 Sep. 27, 2018

Related U.S. Application Data

(63) Continuation of application No. PCT/CN2015/095889, filed on Nov. 28, 2015.

(51) Int. Cl.
| | | |
|---|---|---|
| H01P 1/205 | (2006.01) | |
| H01P 7/10 | (2006.01) | |
| H01P 1/20 | (2006.01) | |
| H01P 7/04 | (2006.01) | |
| H01P 1/212 | (2006.01) | |
| H05K 1/18 | (2006.01) | |

(52) U.S. Cl.
CPC .......... *H01P 1/2053* (2013.01); *H01P 1/2002* (2013.01); *H01P 1/2056* (2013.01); *H01P 1/212* (2013.01); *H01P 7/04* (2013.01); *H01P 7/10* (2013.01); *H05K 1/181* (2013.01); *H05K 2201/1006* (2013.01)

(58) Field of Classification Search
CPC ......... H01P 1/2056; H01P 1/2053; H01P 7/04
USPC .................................................. 333/206, 222
See application file for complete search history.

(56) References Cited

U.S. PATENT DOCUMENTS

| | | |
|---|---|---|
| 5,410,285 A | 4/1995 | Konishi |
| 5,796,320 A | 8/1998 | Hattori et al. |

(Continued)

FOREIGN PATENT DOCUMENTS

| | | |
|---|---|---|
| CN | 1161581 A | 10/1997 |
| CN | 1236195 A | 11/1999 |

(Continued)

OTHER PUBLICATIONS

Chinese Office Action issued in Chinese Application No. 201580001809.9 dated Nov. 2, 2018, 16 pages.

(Continued)

*Primary Examiner* — Benny T Lee

(74) *Attorney, Agent, or Firm* — Fish & Richardson P.C.

(57) ABSTRACT

This application describes an example dielectric resonator and a filter. One example dielectric resonator includes a body and an encirclement wall, where the encirclement wall is saliently disposed on a surface of the body. The encirclement wall of the dielectric resonator encircles the surface of the body to form a cavity area, where the encirclement wall isolates the cavity area from external space of the encirclement wall.

16 Claims, 4 Drawing Sheets

(56) References Cited

U.S. PATENT DOCUMENTS

| | | | |
|---|---|---|---|
| 5,929,725 A | 7/1999 | Toda et al. | |
| 6,137,384 A | 10/2000 | Kubota et al. | |
| 6,204,738 B1* | 3/2001 | Toda et al. | H01P 1/2056 333/134 |
| 6,236,288 B1* | 5/2001 | Tsujiguchi | H01P 1/2136 333/134 |
| 6,294,969 B1* | 9/2001 | Matsuo et al. | H01P 1/2056 333/134 |
| 6,353,374 B1 | 3/2002 | Matsumoto et al. | |
| 2001/0052832 A1* | 12/2001 | Gotoh et al. | H01P 1/2056 333/202 |
| 2004/0212460 A1 | 10/2004 | Harada | |
| 2008/0231391 A1 | 9/2008 | Takubo et al. | |
| 2012/0212387 A1* | 8/2012 | Horiuchi et al. | H01P 1/2053 343/850 |
| 2012/0326805 A1 | 12/2012 | Nummerdor | |
| 2014/0097913 A1 | 4/2014 | Cooper et al. | |
| 2015/0325902 A1 | 11/2015 | Yu et al. | |
| 2015/0364808 A1 | 12/2015 | Zhao et al. | |

FOREIGN PATENT DOCUMENTS

| | | |
|---|---|---|
| CN | 2867619 Y | 2/2007 |
| CN | 201749933 U | 2/2011 |
| CN | 201749934 U | 2/2011 |
| CN | 102509820 A | 6/2012 |
| CN | 102931463 A | 2/2013 |
| CN | 103000983 A | 3/2013 |
| CN | 103022627 A | 4/2013 |
| CN | 203103474 U | 7/2013 |
| CN | 203277600 U | 11/2013 |
| CN | 203434259 U | 2/2014 |
| CN | 104009276 A | 8/2014 |
| EP | 0869572 A2 | 10/1998 |
| EP | 1298758 A2 | 4/2003 |
| EP | 1505687 A1 | 2/2005 |
| EP | 1764858 A1 | 3/2007 |
| JP | S5071247 A | 6/1975 |
| JP | S62252202 A | 11/1987 |
| JP | H0786823 | 3/1995 |
| JP | H098513 A | 1/1997 |
| JP | H09214206 A | 8/1997 |
| JP | 2007088642 A | 4/2007 |

OTHER PUBLICATIONS

Extended European Search Report issued in European Application No. 15909106.5 dated Oct. 29, 2018, 7 pages.

International Search Report issued in International Application No. PCT/CN2015/095889 dated Jul. 1, 2016, 7 pages.

Office Action issued in Japanese Application No. 2018-527093 dated May 7, 2019, 8 pages (with English translation).

Office Action issued in Japanese Application No. 2018-527093 dated Aug. 13, 2019, 8 pages (with English translation).

\* cited by examiner

DIELECTRIC RESONATOR AND FILTER COMPRISING A BODY WITH A RESONANT HOLE SURROUNDED BY AN ENCIRCLEMENT WALL HAVING A RING SHAPED EXPOSED DIELECTRIC AREA

CROSS-REFERENCE TO RELATED APPLICATIONS

This application is a continuation of International Application No. PCT/CN2015/095889, filed on Nov. 28, 2015, the disclosure of which is hereby incorporated by reference in its entirety.

TECHNICAL FIELD

This application relates to the field of communications technologies, and in particular, to a dielectric resonator and a filter including the dielectric resonator.

BACKGROUND

As volumes of base station modules are increasingly small, dielectric filters with high power and high performance (for example, a transverse electromagnetic (TEM) mode dielectric filter, and a waveguide-filled dielectric filter) have increasingly wide applications in mobile communications devices. For an application of a dielectric filter in a base station, requirements for isolation of the dielectric filter (isolation between a transmit channel and a receive channel), assemblability (e.g., how a dielectric is assembled in a base station module), and long-term use reliability (e.g., use reliability in a base station environment with high power or a harsh environment) are increasingly higher. The dielectric filter can satisfy use requirements for the dielectric filter in the base station module only when design and the assemblability of the dielectric filter are continuously improved.

Using a TEM mode dielectric filter as an example, the TEM mode dielectric filter includes multiple dielectric resonators. Signals among the resonators among open-circuit surfaces of the dielectric filter are leaked to each other. With the impact of space radiation, it is difficult to improve out of band suppression performance of the filter, and for a duplexer whose frequency band interval between a transmit filter and a receive filter is narrow, it is difficult to improve transmit and receive isolation to above 80 dBc. Therefore, how to improve leakage reduction among open-circuit surfaces of a dielectric filter, shift a harmonic of the dielectric filters away, and improve high frequency suppression performance of a dielectric resonator are subjects that are continuously studied in the industry.

SUMMARY OF THE INVENTION

A technical problem to be resolved by embodiments of this application is to provide a dielectric resonator and a filter, so as to improve leakage reduction among open-circuit surfaces of the filter, and have advantages of helping to shift a harmonic away and improving high frequency suppression performance of the dielectric resonator.

According to a first aspect, a dielectric resonator is provided, including a body and an encirclement wall, where the body is a dielectric material whose dielectric constant is greater than 1, the encirclement wall is disposed on a surface of the body, the encirclement wall encircles the surface of the body to form a cavity area, the encirclement wall isolates the cavity area from external space of the encirclement wall, and the encirclement wall includes a top surface, an inner side surface, and an outer side surface, where the inner side surface and the outer side surface are disposed opposite to each other and both connected between the top surface and the body, the top surface is located on a surface, away from the body, of the encirclement wall, the inner side surface is a surface, which faces the cavity area, of the encirclement wall, the outer side surface faces the external space of the encirclement wall, the top surface is covered with a metal layer, and the outer side surface is covered with a metal layer.

In a first possible implementation manner of the first aspect, the outer side surface of the encirclement wall and a surface, which is connected to the outer side surface, of the body are coplanar.

With reference to the first possible implementation manner of the first aspect, in a second possible implementation manner, the body is further provided with a resonant hole, where the resonant hole is in communication with the cavity area.

With reference to the second possible implementation manner of the first aspect, in a third possible implementation manner, the resonant hole is a through hole or a blind hole.

With reference to any one of the first aspect or the first to the third possible implementation manners of the first aspect, in a fourth possible implementation manner, all surfaces of the body are covered with a metal layer.

With reference to the second or the third possible implementation manner of the first aspect, in a fifth possible implementation manner of the first aspect, the surface of the body includes a dielectric exposed area, where the dielectric exposed area is disposed surrounding the resonant hole, and other surfaces of the body except the dielectric exposed area are all covered with a metal layer.

With reference to the fifth possible implementation manner of the first aspect, in a sixth possible implementation manner, the dielectric exposed area disposed surrounding the resonant hole is of a ring shape and located at a position, adjacent to the resonant hole, on a bottom wall of the cavity area.

With reference to the fifth possible implementation manner of the first aspect, in a seventh possible implementation manner, a quantity of the resonant holes is at least one.

With reference to any one of the first aspect or the first to the third possible implementation manners of the first aspect, in an eighth possible implementation manner, the body has a shape of a cube, a cuboid, or a cylinder.

According to a second aspect, a filter is provided, including at least one dielectric resonator provided in any one of the implementation manners of the first aspect and a substrate, where the top surface of the encirclement wall of the at least one dielectric resonator is connected to the substrate.

In a first possible implementation manner of the second aspect, the top surface is fastened to the substrate by means of soldering.

With reference to the first possible implementation manner of the second aspect, in a second possible implementation manner of the second aspect, a quantity of the dielectric resonators is two or more, the two or more dielectric resonators are arranged side by side in the filter, and all top surfaces of encirclement walls of the dielectric resonators are coplanar, so as to be soldered on the substrate together.

With reference to the first possible implementation manner of the second aspect, in a third possible implementation manner of the second aspect, the substrate is a metal substrate or a circuit board.

In this application, for the dielectric resonator, an encirclement wall is connected to a surface of a body, the encirclement wall encircles a cavity area, and a metal layer is covered on an outer side surface of the encirclement wall, so that the cavity area is shielded and isolated from external space of the encirclement wall. When the dielectric resonator is used in a filter, a top surface of the encirclement wall is fastened and connected to a substrate in the filter, and the top surface of the encirclement wall may be directly fastened by means of soldering. The encirclement wall can be grounded, so that the filter can be easily installed, In addition, because an open-circuit surface of the filter and a leakage source are disposed in the cavity area, and the cavity area has been entirely isolated from the outside by using the metal layer and the substrate, this application can ensure physical isolation among leakage sources of the filter, and improve isolation among dielectric resonators. Besides, signal leakage may occur on an open-circuit surface of the dielectric resonator (referring to a surface of the body in the cavity area), but the open-circuit surface can be entirely isolated from an external environment by means of the connection between the encirclement wall and the substrate, so as to reduce the signal leakage. By means of a disposition of the encirclement wall, the dielectric resonator can push a frequency that is not required (also referred to as a harmonic) away to reduce impact of the harmonic on working frequency performance. The dielectric resonator in this application has advantages of pushing the harmonic of the filter away and improving high frequency suppression performance of the dielectric resonator.

DESCRIPTION OF THE EMBODIMENTS

The following describes the technical solutions in the embodiments of this application with reference to the accompanying drawings in the embodiments of this application.

In the specification, claims, and accompanying drawings of this application, the terms "first", "second", "third", "fourth", and so on (if existent) are intended to distinguish between similar objects but do not necessarily indicate a specific order or sequence. It should be understood that the terms are interchangeable in proper circumstances so that the embodiments of this application described herein can be implemented in orders other than the order illustrated or described herein. Moreover, the terms "include", "contain" and any other variants mean to cover the non-exclusive inclusion, for example, a process, method, system, product, or device that includes a list of steps or units is not necessarily limited to those units, but may include other units not expressly listed or inherent to such a process, method, system, product, or device.

Detailed descriptions are separately provided below by using specific embodiments.

Figure 1:
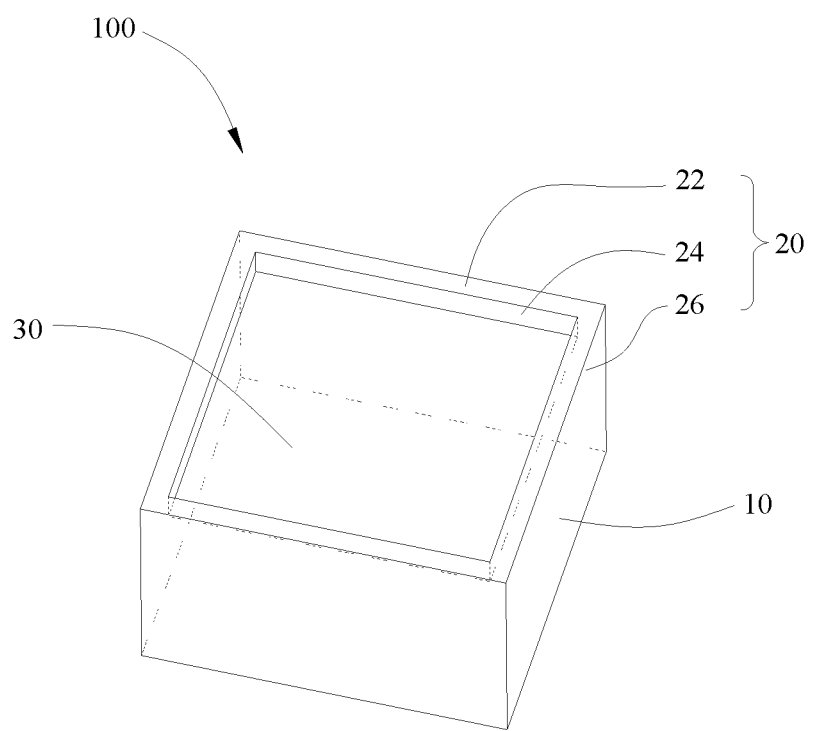
FIG. 1 is a schematic three-dimensional diagram of a dielectric resonator according to a first implementation manner of this application.
Figure 2:
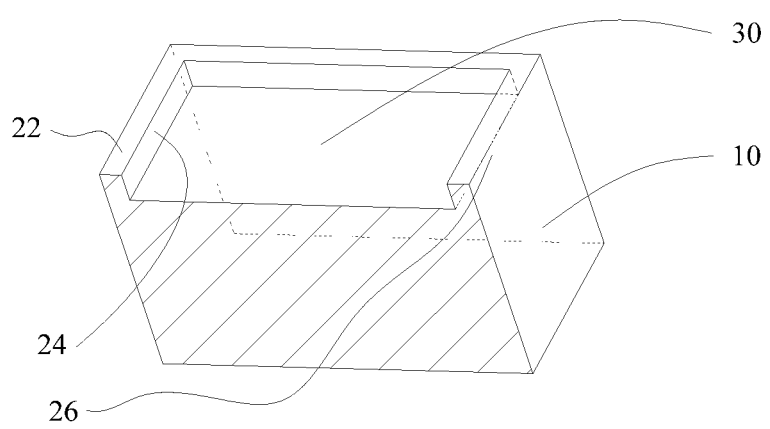
FIG. 2 is a sectional view of FIG. 1.

Referring to FIG. 1 and FIG. 2, a dielectric resonator 100 (FIG. 1) provided in a first implementation manner of this application includes a body 10 and an encirclement wall 20 (FIG. 1), where the body 10 includes a dielectric material whose dielectric constant is greater than 1. Because a vacuum dielectric constant is 1, the dielectric constant being greater than 1 means that the body 10 is filled with a dielectric material. The encirclement wall 20 is disposed on a surface of the body 10, and the encirclement wall 20 encircles the surface of the body 10 to form a cavity area 30. In this implementation manner, the body 10 and the encirclement wall 20 can be integrally molded, and both materials include the dielectric material whose dielectric constant is greater than 1. The encirclement wall 20 is formed on an end surface of the body 10, and the encirclement wall 20 has a closed frame shape, where the closed frame shape may be a square frame structure or may be a round frame structure, or may be designed to be another shape. The encirclement wall 20 isolates the cavity area 30 from external space of the encirclement wall 20. The isolation herein refers to complete separation, and there is no gap that can enable the cavity area 30 to be in communication with the external space.

The encirclement wall 20 includes a top surface 22, an inner side surface 24, and an outer side surface 26, where the inner side surface 24 and the outer side surface 26 are disposed opposite to each other and both connected between the top surface 22 and the body 10, the top surface 22 is located on a surface, away from the body 10, of the encirclement wall 20, the inner side surface 24 is a surface, which faces the cavity area 30, of the encirclement wall 20, and the outer side surface 26 faces the external space of the encirclement wall 20. Specifically, in this implementation manner, the inner side surface 24 and the outer side surface 26 are parallel to each other, and both the inner side surface 24 and the outer side surface 26 are perpendicular to the top surface 22. In another implementation manner, the inner side surface 24 and the outer side surface 26 may be not parallel and may be designed to be relatively tilted with each other.

A metal layer is covered on the outer side surface 26. In an implementation manner, a metal layer is also covered on the inner side surface 24; and in another implementation manner, a metal layer does not need to be covered on the inner side surface 24. That "the metal layers are covered on the inner side surface 24 and the outer side surface 26" refers to that all areas of the inner side surface 24 and the outer side surface 26 are covered with the metal layer.

The top surface 22 is covered with a metal layer, and the top surface 22 is configured to be connected to a substrate of a filter. In this implementation manner, the top surface 22 is of a planar structure, and in another implementation manner, the top surface 22 may be designed to be another shape, for example, an arc that is convex outwards, an arc that is convex inwards, or an irregular undulant shape (such as a jagged shape or a wavy shape). The top surface 22 is designed to be a non-planar structure. In addition, a structure that matches the shape of the top surface 22 can be disposed at a position corresponding to the substrate. After the top surface 22 matches the substrate, combination stability between the dielectric resonator 100 and the substrate can be enhanced.

The dielectric resonator 100 can be applied to a filter, and can help to shift a harmonic away. A surface, at the bottom of the cavity area 30, of the body 10 can be considered as an open-circuit surface of the dielectric resonator 100. In this application, the encirclement wall 20 and the metal layers are disposed, so that the cavity area 30 is isolated from the external space. When the top surface 22 of the encirclement wall 20 of the dielectric resonator 100 is connected to the substrate of the filter (because the top surface 22 is provided with a metal layer, the top surface 22 can be directly fastened by means of soldering), this application can reduce signal leakage of the open-circuit surface.

As shown in FIG. 1, the outer side surface 26 of the encirclement wall 20 and a surface, connected to the outer side surface 26, of the body 10 are coplanar, and this structure feature enables the dielectric resonator 100, protected by this application, to have a simple outer surface and to be easily produced and manufactured. In a specific manufacturing process, for the dielectric resonator 100, a groove may be formed on an end surface of the body 10 of a solid structure, where the groove forms the cavity area 30, and four sides of the groove form the encirclement wall 20. A capacity, a depth, and a position of the cavity area 30 are designed (the capacity, the depth, and the position herein are parameters that can be changed or adjusted in a process of designing the dielectric resonator 100, and the three parameters may be changed at the same time, or one parameter therein may be separately changed, or two parameters therein may be changed), so that the dielectric resonator 100 can match different frequency ranges. For dielectric resonators 100 having a same volume, a larger depth of the cavity area 30 (the depth herein refers to a perpendicular distance between the top surface 22 of the encirclement wall 20 and a bottom surface of the cavity area 30) can enable a frequency of the dielectric resonator 100 to be higher. The dielectric resonator 100 includes many different frequencies, because the frequencies are different, sensitiveness of the dielectric resonator 100 to design of the groove is different. In this application, by means of the design of the groove, a required frequency is designed to be a frequency that is insensitive to the design of the groove, and a frequency that is not required (that is, a harmonic) is shifted away, where the harmonic generally refers to a frequency in a high frequency band, and a meaning of shifting away refers to that the harmonic is as far away as possible from a normal working frequency of the dielectric resonator 100 (also referred to as high frequency suppression). Therefore, the dielectric resonator 100 in this application helps to shift the harmonic away and facilitates implementation of the high frequency suppression.

In another implementation manner of this application, a structure of the encirclement wall 20 may be disposed on multiple end surfaces of the body 10 (not shown in a figure), where a top surface 22 of an encirclement wall 20 on an end surface is connected to the substrate, and dispositions of other encirclement walls 20 can change the frequency of the dielectric resonator 100.

Referring to FIG. 3, FIG. 4, FIG. 5 and FIG. 6, a structure of a dielectric resonator 100 (FIG. 1) provided in a second implementation manner of this application is shown. For the dielectric resonator 100 in this implementation manner, based on the dielectric resonator 100 in the first implementation manner, a feature of a resonant hole 40 is added. The body 10 is further provided with a resonant hole 40, where the resonant hole 40 is in communication with the cavity area 30. That is, an opening of the resonant hole 40 is located at a bottom wall of the cavity area 30. In a preferred embodiment, a position of the resonant hole 40 is a central position of the cavity area 30. The resonant hole 40 is designed, so that a physical size (for example, a volume) of the body 10 can be changed. With the change of the physical size of the body 10, a frequency corresponding to the dielectric resonator 100 can be changed.

Figure 3:
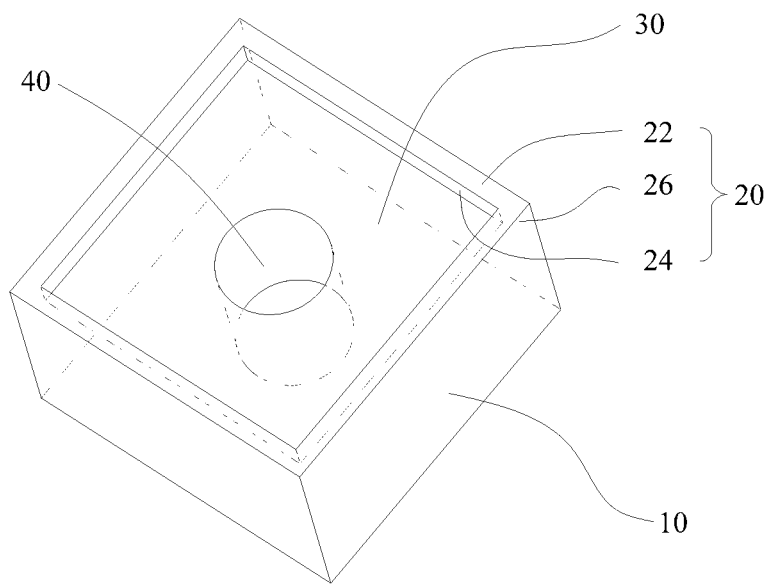
FIG. 3 is a schematic three-dimensional diagram of a dielectric resonator according to a second implementation manner of this application.
Figure 4:
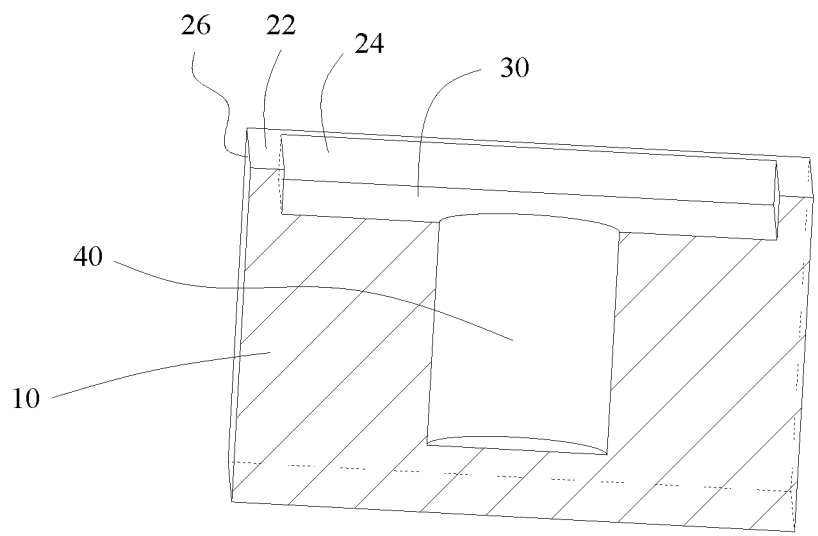
FIG. 4 is a sectional view of FIG. 3.
Figure 5:
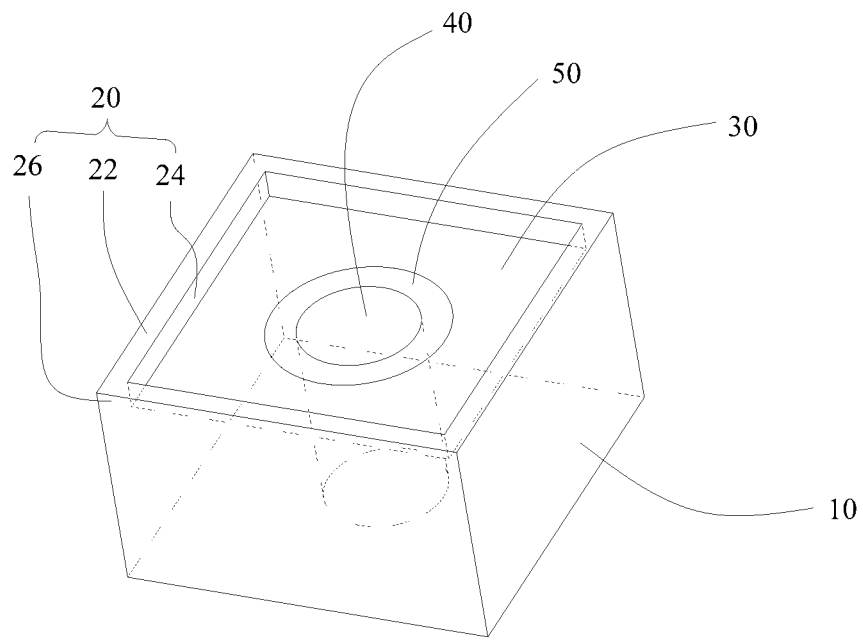
FIG. 5 is a schematic three-dimensional diagram of a dielectric resonator according to a third implementation manner of this application.
Figure 6:
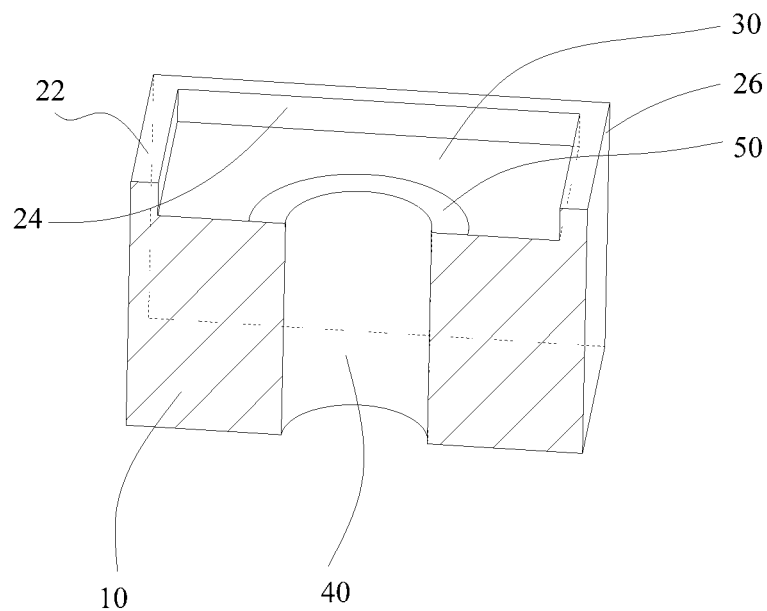
FIG. 6 is a sectional view of FIG. 5.

A sectional shape of the resonant hole 40 may be any shape such as a circle, a square, or a triangle, which is not limited in this application. The resonant hole 40 may be a through hole (as shown in FIG. 5 and FIG. 6) or a blind hole (as shown in FIG. 3 and FIG. 4). Specifically, when a diameter of the resonant hole 40 remains unchanged, a larger depth of the resonant hole 40 indicates a lower frequency, and the "frequency" herein refers to a self-resonant frequency of the dielectric resonator 100. In a cavity of given space, when electromagnetic disturbance is observed on the cavity, and a disturbance frequency exactly enables average electric energy to equal average magnetic energy in the cavity, resonance occurs, where the frequency is referred to as a resonant frequency. When volumes of dielectric objects are the same and depths of resonant holes 40 are the same, a larger diameter of the resonant hole 40 indicates a lower frequency. The depth of the resonant hole 40 mentioned herein refers to a perpendicular distance between a bottom opposite to an opening in the resonant hole 40 and an opening position of the resonant hole 40.

All surfaces of the body 10 are covered with a metal layer. In a manufacturing process of the dielectric resonator 100, a dielectric material can be used to form a part of the body 10 and the encirclement wall 20 (FIGS. 3 and 5) that includes a top surface 22, an inner side surface 24, and an outer side surface 26, and then the entire body 10 and the entire encirclement wall 20 are electroplated, so that all the surfaces are covered with a metal layer.

Referring to FIG. 5 and FIG. 6, a structure of a dielectric resonator 100 (FIG. 1) provided in a third implementation manner of this application is shown. For the dielectric resonator 100 in this implementation manner, based on the dielectric resonator 100 in the second implementation manner, a feature of a dielectric exposed area 50 is added. The surface of the body 10 includes a dielectric exposed area 50, where the dielectric exposed area 50 is disposed surrounding the resonant hole 40, and other surfaces of the body 10 except the dielectric exposed area 50 are all covered with a metal layer. In this implementation manner, an area of the dielectric exposed area 50 is adjusted, and frequencies of the dielectric resonator 100 and the filter are further adjusted. For dielectric resonators 100 having a same volume, a larger area of the dielectric exposed area 50 indicates a higher frequency. The dielectric exposed area 50 may be obtained by removing a part of the metal layer. For example, the part of the metal layer may be removed by etching or mechanically polishing. Specifically, the dielectric exposed area 50 can be determined during design of the filter/a duplexer/a multiplexer. However, because of a processing design error, in an actual performance calibration process of the dielectric filter/the duplexer/the multiplexer, an objective of performance calibration of the filter/the duplexer/the multiplexer is achieved by removing the metal layer.

The dielectric exposed area has a ring shape and is located at a position, adjacent to the resonant hole 40, on a bottom wall of the cavity area 30. The adjacent position herein may also be described as a position at which the resonant hole 40 and the cavity area 30 are tangent to each other, or a position at an edge of the resonant hole 40 on the bottom wall of the cavity area 30. The dielectric exposed area 50 is disposed at the position, adjacent to the resonant hole 40, on the bottom wall of the cavity area 30. For the dielectric resonator 100, a resonant frequency of a half wavelength is converted to a resonant frequency of a quarter wavelength to form a TEM mode, so as to achieve an objective of reducing a volume of a device (for example, the dielectric resonator 100, the filter, the duplexer, or the multiplexer). A specific design principle is: for a resonant device with closed space (an outer wall is metal), if two ends are open-circuited or short-circuited, the resonant device is a resonant device of a half wavelength; and if one end is short-circuited and the other end is open-circuited (dielectric exposure indicates an open-circuit), the resonant device is a resonant device of a quarter wavelength. A wavelength corresponds to a frequency, and with a same volume, a resonant frequency corresponding to a resonant cavity of a quarter wavelength is lower than a frequency corresponding to a resonant cavity of a half wavelength. The dielectric exposed area is generally designed to a ring shape mainly for easy design and processing. Certainly, the dielectric exposed area 50 may also be another shape, for example, a square shape or a polygonal ring shape.

Further, there is at least one resonant hole 40, and there are two or more resonant holes 40. With an increase in the quantity of the resonant holes 40, a volume of the cavity area 30 in the body 10 can be changed, and the frequency of the dielectric resonator 100 is further changed.

The body 10 has a shape of a cube, a cuboid, or a cylinder. Certainly, the body 10 may also be another shape, which is not limited in this application.

Figure 7:
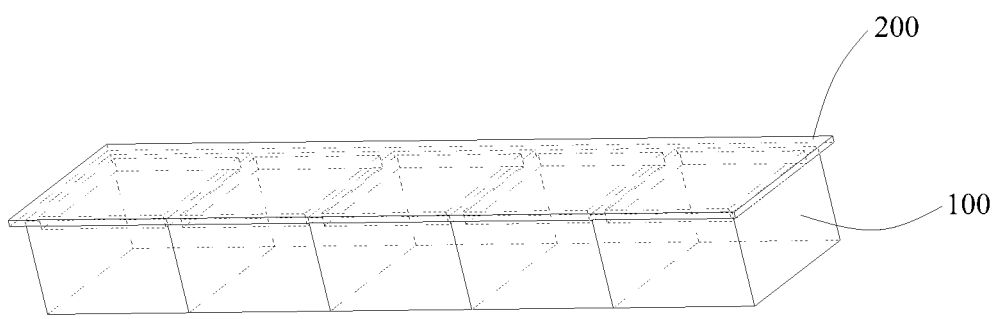
FIG. 7 is a schematic diagram showing that multiple dielectric resonators are installed on a substrate according to an implementation manner of this application.
Figure 8:
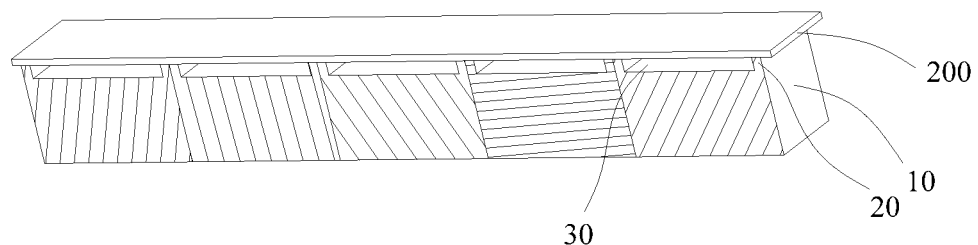
FIG. 8 is a sectional view of FIG. 7.

Referring to FIG. 7 and FIG. 8, this application further provides a filter (the filter may also be a duplexer or a multiplexer), including at least one dielectric resonator 100 (FIG. 7 and a substrate 200, where a top surface (e.g., top surface 22 of FIG. 1) of a encirclement wall (e.g., encirclement wall 20 of FIG. 1 of the at least one dielectric resonator 100 is connected to the substrate 200. In this implementation manner, the top surface is fastened to the substrate 200 by means of soldering. Certainly, the top surface and the substrate 200 may be fastened in another manner, for example, the top surface may be connected to the substrate 200 by means of attaching or by using a fastener (such as a fixing screw).

The substrate 200 is a metal substrate or a circuit board. The metal substrate may be directly fastened and connected to a metal layer of a top surface of the encirclement wall 20 (FIG. 8) by means of soldering. A metal layer, such as a copper foil, is provided on a surface of the circuit board, and the metal layer on the surface of the circuit board may also be fastened and connected to the metal layer of the top surface of the encirclement wall 20 by means of soldering. A manner of performing fastening by means of soldering enhances an isolation effect between a cavity area 30 (FIG. 8) and external space, so that space leakage and interference of the filter in this application are greatly reduced, and suppression and isolation of the filter are directly improved. Because an extra fastener does not need to be added, performing fastening by means of soldering has advantages of improving assembly reliability and reducing assembly costs.

There are two or more dielectric resonators 100, and the two or more dielectric resonators 100 are arranged side by side in the filter, and all top surfaces of encirclement walls 20 of the dielectric resonators 100 are the same, so as to be soldered on the substrate 200 together. As shown in FIG. 7 and FIG. 8, five dielectric resonators 100 shown in the figures are disposed side by side, and adjacent dielectric resonators 100 are coupled and connected, so as to implement transmission of a signal among the dielectric resonators 100.

For the dielectric resonator 100, by means of dispositions of a body 10 (FIG. 8) and an encirclement wall 20, the encirclement wall 20 is connected to a surface of the body 10, the encirclement wall 20 encircles a cavity area 30 (FIG. 8), and a metal layer is covered on an inner side surface (e.g., inner side surface 24 of FIG. 1) and/or an outer side surface (e.g., outer side surface 26 of FIG. 1) of the encirclement wall 20, so that the cavity area 30 is shielded and isolated from external space of the encirclement wall 20. When the dielectric resonator 100 is used on a filter, a top surface (e.g., top surface 22 of FIG. 1 of the encirclement wall 20 is fastened and connected to a substrate 200 in the filter, and the top surface of the encirclement wall 20 may be directly fastened by means of soldering. The encirclement wall 20 can be grounded, so that the filter can be easily installed. In addition, because an open-circuit surface of the filter and a leakage source are disposed in the cavity area 30, and the cavity area 30 has been entirely isolated from the outside by using the metal layer and the substrate 200, embodiments of this application can ensure physical isolation among leakage sources of the filter, that is, isolation among the dielectric resonators 100 can be improved. Besides, signal leakage may occur on an open-circuit surface of the dielectric resonator 100 (referring to a surface of the body 10 in the cavity area 30), but the open-circuit surface can be entirely isolated from an external environment by means of the connection between the encirclement wall 20 and the substrate 200, so as to reduce the signal leakage. By means of a structure disposition of the encirclement wall 20, the dielectric resonator 100 can shift a frequency that is not required (also referred to as a harmonic) away to reduce impact of the harmonic on working frequency performance. The dielectric resonator 100 in this application has advantages of shifting the harmonic of the filter away and improving high frequency suppression performance of the dielectric resonator 100.

It can be understood that a filter including the dielectric resonator 100 may be applied to the field of mobile communications technologies, or may be applied to other fields having corresponding requirements. For example, the filter is applied to a base station, when the base station receives a user signal, an interference signal outside a communications channel needs to be controlled to a given level by using the filter; when the base station contacts a user, a signal (which generally has high power) that is sent by the base station to the user may also control an interference signal that is generated by a transmitter and that is outside the channel to an allowed level, so as to avoid interfering with an adjacent channel, and ensure normal communication. In addition, when the filter is a duplexer, the filter may be further to isolate signals in a receive channel and a transmit channel, so as to reduce mutual interference.

Finally, it should be noted that the foregoing embodiments are merely intended for describing the technical solutions of this application, but not for limiting this application. Although this application is described in detail with reference to the foregoing embodiments, a person of ordinary skill in the art should understand that the descriptions are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. A dielectric resonator, comprising:
a body; and
an encirclement wall,
wherein both the body and the encirclement wall comprise a dielectric material whose dielectric constant is greater than 1,
wherein the encirclement wall is disposed on a surface of the body, wherein the surface of the body where the encirclement wall is disposed is covered with a metal layer, wherein the encirclement wall encircles the surface of the body to form a cavity area, wherein the encirclement wall isolates the cavity area from an external space of the encirclement wall, and wherein the encirclement wall comprises a top surface, an inner side surface, and an outer side surface, wherein the inner side surface and the outer side surface are disposed opposite to each other and are both connected between the top surface and the body, wherein the top surface is located on a surface, away from the body, of the encirclement wall, wherein the inner side surface is a surface, which faces the cavity area, of the encirclement wall, wherein the outer side surface faces the external space of the encirclement wall, wherein the top surface is covered with the metal layer, and wherein the outer side surface is covered with the metal layer, wherein the body is further provided with a resonant hole, wherein the surface of the body comprises a dielectric exposed area, wherein the dielectric exposed area is disposed surrounding the resonant hole, wherein the dielectric exposed area is not covered with the metal layer, wherein other surfaces of the body except the dielectric exposed area are all covered with the metal layer, and wherein the dielectric exposed area is of a ring shape and located at a position, adjacent to the resonant hole, on the surface of the body.

2. The dielectric resonator according to claim 1, wherein the outer side surface of the encirclement wall and a surface, which is connected to the outer side surface, of the body are coplanar.

3. The dielectric resonator according to claim 2, wherein the resonant hole is in communication with the cavity area.

4. The dielectric resonator according to claim 3, wherein the resonant hole is a through hole or a blind hole.

5. The dielectric resonator according to claim 3, wherein a quantity of the resonant holes is at least one.

6. The dielectric resonator according to claim 1, wherein all surfaces of the body are covered with the metal layer.

7. The dielectric resonator according to claim 1, wherein the body has a shape of a cube or a cuboid.

8. A filter, comprising at least one dielectric resonator and a substrate,
wherein each one of the at least one dielectric resonator comprises a body and an encirclement wall, wherein a top surface of the encirclement wall is connected to the substrate, wherein both the body and the encirclement wall include a dielectric material whose dielectric constant is greater than 1, wherein the encirclement wall is disposed on a surface of the body, wherein the surface of the body where the encirclement wall is disposed is covered with a metal layer, wherein the encirclement wall encircles the surface of the body to form a cavity area, wherein the encirclement wall isolates the cavity area from an external space of the encirclement wall, and wherein the encirclement wall comprises a top surface, an inner side surface, and an outer side surface, wherein the inner side surface and the outer side surface are disposed opposite to each other and both connected between the top surface and the body, wherein the top surface is located on a surface, away from the body, of the encirclement wall, wherein the inner side surface is a surface, which faces the cavity area, of the encirclement wall, wherein the outer side surface faces the external space of the encirclement wall, wherein the top surface is covered with the metal layer, and wherein the outer side surface is covered with the metal layer, wherein the body is further provided with a resonant hole, wherein the surface of the body comprises a dielectric exposed area, wherein the dielectric exposed area is disposed surrounding the resonant hole, wherein the dielectric exposed area is not covered with the metal layer, wherein other surfaces of the body except the dielectric exposed area are all covered with the metal layer, and wherein the dielectric exposed area is of a ring shape and located at a position, adjacent to the resonant hole, on a bottom wall of the cavity area.

9. The filter according to claim 8, wherein a quantity of the dielectric resonators is two or more, wherein the two or more dielectric resonators are arranged side by side in the filter, and wherein all of the dielectric resonators have respective encirclement walls with top surfaces that are coplanar, so as to be soldered on the substrate together.

10. The filter according to claim 8, wherein the substrate is a metal substrate or a circuit board.

11. The filter according to claim 8, wherein the outer side surface of the encirclement wall and a surface, which is connected to the outer side surface, of the body are coplanar.

12. The filter according to claim 11, wherein the resonant hole is in communication with the cavity area.

13. The filter according to claim 12, wherein the resonant hole is a through hole or a blind hole.

14. The filter according to claim 8, wherein all surfaces of the body are covered with the metal layer.

15. The filter according to claim 12, wherein a quantity of the resonant holes is at least one.

16. The filter according to claim 8, wherein the body has a shape of a cube or a cuboid.

* * * * *